May 15, 1962 G. R. RINGLAND 3,035,239

ENCAPSULATED ELECTRICAL COMPONENT

Filed July 7, 1958

Inventor:
George Russell Ringland
By: Graf, Nierman & Burmeister
Attorneys

United States Patent Office 3,035,239
Patented May 15, 1962

3,035,239
ENCAPSULATED ELECTRICAL COMPONENT

George Russell Ringland, Reading, Mass., assignor to Waters Manufacturing, Inc., Wayland, Mass., a corporation of Massachusetts Filed July 7, 1958, Ser. No. 746,989
5 Claims. (Cl. 336—67)

This invention relates to an improvement in encapsulated electrical components, and more specifically to an improved structure of such components for the purpose of providing secure mounting thereof.

The encapsulation of electrical components, such as circuit impedance elements, vacuum tubes and transistors, and even entire circuits such as amplifiers, has in recent years become commonplace in electronic equipment, particularly in equipment where the effects of moisture and other ambient conditions are critical for proper and long-lived operation. In such constructions, the component is encased in a molded or cast block of protective insulating material. Various plastics, such as epoxy resins, are commonly used as the encapsulating material.

It is common to support electrical components, particularly circuit impedance components such as resistors, tubular condensers, and small coils such as radio-frequency chokes, when wired into a circuit, solely by their electrical leads. Where further support is required, to protect against the effects of vibration, or to relieve the wire leads of the component from the weight of the component, such supports are normally in the form of separate clips or bands encircling or otherwise engaging the component. Heretofore, these practices have been followed with encapsulated components, as with components not so treated.

The present invention stems from the recognition that the employment of an encapsulation block or covering makes possible the provision of secure mounting and securing means for electrical components at substantially no additional cost as compared with encapsulated components in which it is required that either the leads take the strain of holding the component in place, or that mounting means of substantial cost be provided for the component. The present invention finds its greatest utility in components designed for use in equipment which must be guarded against the effects of vibration, which constitutes a severe problem where the component is supported solely by its leads.

Another aspect of the invention relates to the observation that the commonly encountered cylindrical shape of electrical circuit impedance elements is poorly suited to modern techniques of circuit construction, wherein the components are commonly mounted on a circuit board with printed wiring. Accordingly, the present invention provides a novel configuration for the encapsulating block which adds substantially to the ease and convenience of mounting and wiring the electrical components of the invention on flat surfaces such as the surfaces of printed circuit boards.

The construction by which these advantages are obtained, and the fact that they may be obtained at substantially no additional cost as compared to conventional construction, may best be understood by reference to an embodiment of the invention. The embodiment selected for illustration is an encapsulated radio-frequency choke coil wherein the structure employed is of peculiar advantage. Such a choke is shown in the attached drawings, in which.

Figure 1:
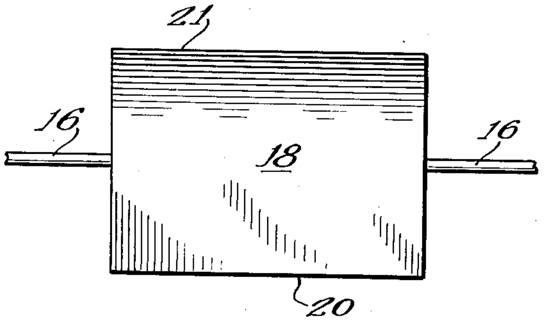
FIGURE 1 is a top plan view of a choke made in accordance with the invention.
Figure 2:
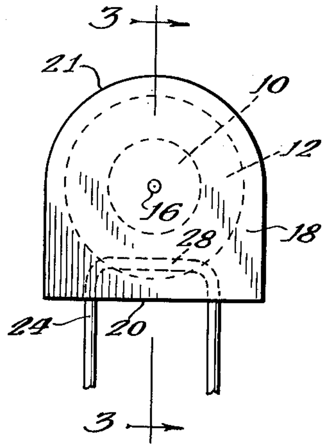
FIGURE 2 is an end view of the choke of FIGURE 1.
Figure 3:
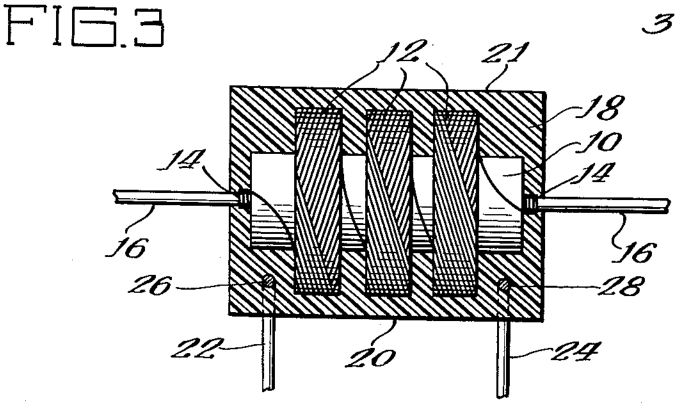
FIGURE 3 is a view in vertical section taken along the line 3—3 of FIGURE 2.

Except for the structure associated with its encapsulation, the choke shown in the drawing is of conventional construction, consisting of a cylindrical core 10 and series-connected pie-windings 12 on the central portion of the core having their terminal portions soldered at 14 to relatively coarse wire leads 16 embedded in the core. The coil is encapsulated in a block 18 of suitable plastic. One side (herein called the bottom, by reference to the orientation shown in the drawing, although it will be obvious that the orientation actually employed is immaterial) is flat, the lower portion of the encapsulation block 18 being in the form of a rectangular parallelepiped. The upper side, however, is semicircular in cross-section, being in the form of a half cylinder about the axis of the coil. The distance from the outer circumference of the pies 12 to the outer surface of the encapsulating block 18 is substantially the same at the center of the bottom surface 20 as around the top 21, thus providing all portions of the choke with the required protection for the windings. In each end of the lower portion of the encapsulation block are embedded U-shaped wires 22 and 24, of which the central portions 26 and 28 are radially inward of the outer circumference of the pies 12, being spaced therefrom in a direction parallel with the flat face 20 but radially outward of the core 10. The wires 22 and 24 are electrically inert, since they are insulated from all portions of the choke coil, and are used solely as a mounting or locking means, as hereinafter described. The location of the wires 22 and 24 beyond the ends of the pie-winding, which is on the central portion of the core 10, permits their being embedded more deeply in the plastic block than the depth corresponding to the thickness of plastic required to protect the windings. The U-shaped configuration of the wires 22 and 24 permits them to be embedded permanently in the encapsulation block in the process of encapsulation of the choke at a negligible increase in cost over encapsulated structures having no such provision, the locking in of the wires being assured without any necessity of taking special precautions to assure bonding of the plastic to the wire.

It will readily be seen that the illustrated structure for an encapsulated choke is readily susceptible of convenient use, secure from effects of vibration, under a large variety of mounting conditions. For example, the illustrated choke may readily be mounted on a metal chassis by insertion of the extending ends of the flexible wires 22 and 24 through suitable apertures and mere twisting together of the ends of each of the wires.

Figure 4:
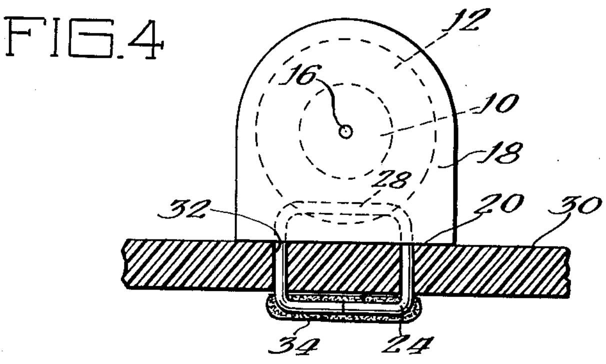
FIGURE 4 is a view partially in section showing the manner of installation of the choke of the previous figures on a flat mounting surface such as a printed circuit board.

In FIGURE 4, there is shown the manner of installation of the described choke on an insulating circuit board 30, which may have printed wiring (not shown). In such a use, the ends of the wires 22 and 24 are inserted through apertures 32 provided for the purpose in the board 30 and then bent over to meet. When the dip-soldering step, which is commonly employed with such boards for soldering of the circuit elements, is taken, the ends of each wire 22 and 24 are joined by a solder joint at 34, thus securely locking the choke to the circuit board without any additional operation.

It will be noted that the illustrated shape of the encapsulation block permits flat mounting of the component, the only additional space required as compared with a cylindrical component being space which is essentially useless where a cylindrical component is mounted on a flat surface.

The application of the teachings of the invention to encapsulated electrical components differing greatly from the particular embodiment illustrated in the drawing will be obvious to those skilled in the art. Accordingly, the scope of the invention should not be deemed to be limited to the particular embodiment illustrated and described, but shall be determined solely from the appended claims.

What is claimed is:

1. An encapsulated electrical component comprising a circuit element having a plurality of wire leads connected thereto, said circuit element being contained in a unitarily formed block of protective insulating material having a flat side, and a U-shaped wire having its ends extending from the flat side of the block and its central portion embedded in the block and insulated from the circuit element to serve as fastening means for the component, the innermost portion of the U-shaped wire being further from the flat face than the outermost portion of the element and spaced from said outermost portion in a direction parallel with the flat face, so that the wire may be embedded at a substantial depth without corresponding increase of the overall dimensions of the component.

2. An encapsulated electrical component comprising a cylindrical impedance element having a plurality of wire leads connected thereto, said impedance element being contained in a unitarily formed block of protective insulating material, one side of said block being flat and the opposite side being semicircular about the axis of the impedance element, the thickness of said protective material being substantially the same on the semicircular side as at the center of the flat side, and a U-shaped wire other than said leads having its ends extending from the flat side of the block and its central portion embedded in the block and insulated from the impedance element to serve as fastening means for the component, the innermost portion of the U-shaped wire being further from the flat face than the outermost portion of the element and spaced from said outermost portion in a direction parallel with the flat face, so that the wire may be embedded at a substantial depth without corresponding increase of the overall dimensions of the component.

3. An encapsulated coil comprising a cylindrical core, windings on the central portion of the core, axially extending wire leads connected to the terminals of the windings, a unitarily formed block of protective insulating material encasing all of the aforesaid other than the ends of the wire leads, and U-shaped wires embedded in the block and having their ends extending therefrom, the central portions of said U-shaped wires being radially inward of the outer circumference of the windings and longitudinally outward therefrom at the ends of the core, the block being flat on the side having the ends of the wires extending therefrom and semicircular about the axis of the impedance element on the opposite side, whereby the coil may be mounted securely on a flat surface with a minimum of added space requirement, the wire ends extending from the flat surface serving as securing means.

4. An encapsulated electrical component comprising a circuit element having a plurality of wire leads connected thereto, said circuit element being contained in a unitarily formed block of protective insulating material having a flat side, and a U-shaped fastening member having its ends extending from the flat side of the block and its central portion embedded in the block and insulated from the circuit element to serve as fastening means for the component, the innermost portion of the fastening member being further from the flat face than the outermost portion of the element and spaced from said outermost portion in a direction parallel with the flat face, so that the fastening member may be embedded at a substantial depth without corresponding increase of the overall dimensions of the component.

5. An encapsulated electrical component comprising a circuit element having a plurality of wire leads connected thereto, said circuit element being contained in a unitarily formed block of protective insulating material having a flat side, and a U-shaped fastening member having its ends extending from the flat side of the block and its central portion embedded in the block and insulated from the circuit element to serve as fastening means for the component, the circuit element having longitudinal portions of different dimension in the direction away from the flat face, and the innermost portion of the fastening member being in the longitudinal region of a portion of the circuit element of relatively small dimension, so that the fastening member is embedded at a substantial depth without increase of the overall dimensions of the component.

References Cited in the file of this patent

UNITED STATES PATENTS

| | | |
|---|---|---|
| 2,482,902 | Clark | Sept. 27, 1949 |
| 2,552,999 | Pannell | May 15, 1951 |
| 2,558,798 | Thom | July 3, 1951 |
| 2,758,261 | Armstrong et al. | Aug. 7, 1956 |
| 2,916,713 | Johnston | Dec. 8, 1959 |

FOREIGN PATENTS

| | | |
|---|---|---|
| 213,809 | Switzerland | June 3, 1941 |
| 305,554 | Switzerland | May 2, 1955 |
| 983,342 | France | Feb. 7, 1951 |